(12) United States Patent
Zhang et al.

(10) Patent No.: US 12,300,771 B2
(45) Date of Patent: May 13, 2025

(54) LENS MODULE

(71) Applicant: SEOUL SEMICONDUCTOR (SHENZHEN) CO., LTD., Shenzhen (CN)

(72) Inventors: Mingjun Zhang, Shenzhen (CN); Do Kwang Lee, Ansan-si (KR); Zhisheng Zhang, Shenzhen (CN)

(73) Assignee: SEOUL SEMICONDUCTOR (SHENZHEN) CO., LTD., Shenzhen (CN)

( * ) Notice: Subject to any disclaimer, the term of this patent is extended or adjusted under 35 U.S.C. 154(b) by 443 days.

(21) Appl. No.: 17/771,767

(22) PCT Filed: Oct. 26, 2020

(86) PCT No.: PCT/CN2020/123754
§ 371 (c)(1),
(2) Date: Apr. 25, 2022

(87) PCT Pub. No.: WO2021/078303
PCT Pub. Date: Apr. 29, 2021

(65) Prior Publication Data
US 2022/0376149 A1    Nov. 24, 2022

(30) Foreign Application Priority Data
Oct. 25, 2019   (CN) .......................... 201911023036.0

(51) Int. Cl.
*H01L 33/58* (2010.01)
*H01L 25/075* (2006.01)
*H01L 33/48* (2010.01)

(52) U.S. Cl.
CPC .......... *H01L 33/58* (2013.01); *H01L 25/0753* (2013.01); *H01L 33/483* (2013.01)

(58) Field of Classification Search
CPC .... H01L 33/58; H01L 33/483; H01L 25/0753
See application file for complete search history.

(56) References Cited

U.S. PATENT DOCUMENTS

| 2008/0012036 A1 | 1/2008 | Loh et al. |
| 2011/0176863 A1 | 7/2011 | Hanley et al. |
| 2012/0299019 A1 | 11/2012 | Lin et al. |

FOREIGN PATENT DOCUMENTS

| CN | 102194973 A  | 9/2011 |
| CN | 202905777 U  | 4/2013 |

(Continued)

OTHER PUBLICATIONS

Search Report from corresponding European Patent Application No. 20878134, dated Nov. 30, 2023, (8 pages).

(Continued)

*Primary Examiner* — Timor Karimy
(74) *Attorney, Agent, or Firm* — Perkins Coie LLP

(57) ABSTRACT

Disclosed herein is a lense module. A lens module according to an exemplary embodiment of the present disclosure includes a substrate having a plurality of light emitting regions, a light emitting devices provided in each of the plurality of light emitting regions to emit light, and a lens unit provided on the substrate to cover the light emitting devices, a glue contacting the substrate and the lens unit to secure the substrate and the lens unit, and a support member provided in the glue and mounted on the substrate. The support member includes a hump for increasing a contact area between the support member and the glue, and a clip connected to the lens unit.

15 Claims, 14 Drawing Sheets

(56) References Cited

FOREIGN PATENT DOCUMENTS

| | | | |
|---|---|---|---|
| CN | 104425697 | * | 9/2013 |
| CN | 103515517 | A | 1/2014 |
| CN | 103807803 | A | 5/2014 |
| CN | 203963815 | U | 11/2014 |
| CN | 104425697 | A | 3/2015 |
| CN | 105823007 | A | 8/2016 |
| EP | 2966346 | A1 | 1/2016 |

OTHER PUBLICATIONS

Office Action from related corresponding Chinese Application No. 201911023036.0, dated Jan. 7, 2025.

* cited by examiner

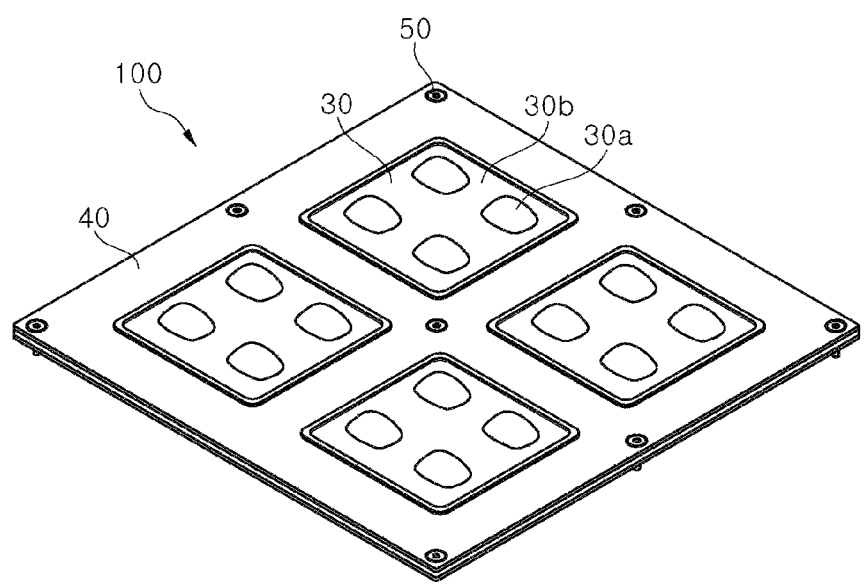
[FIG. 1]

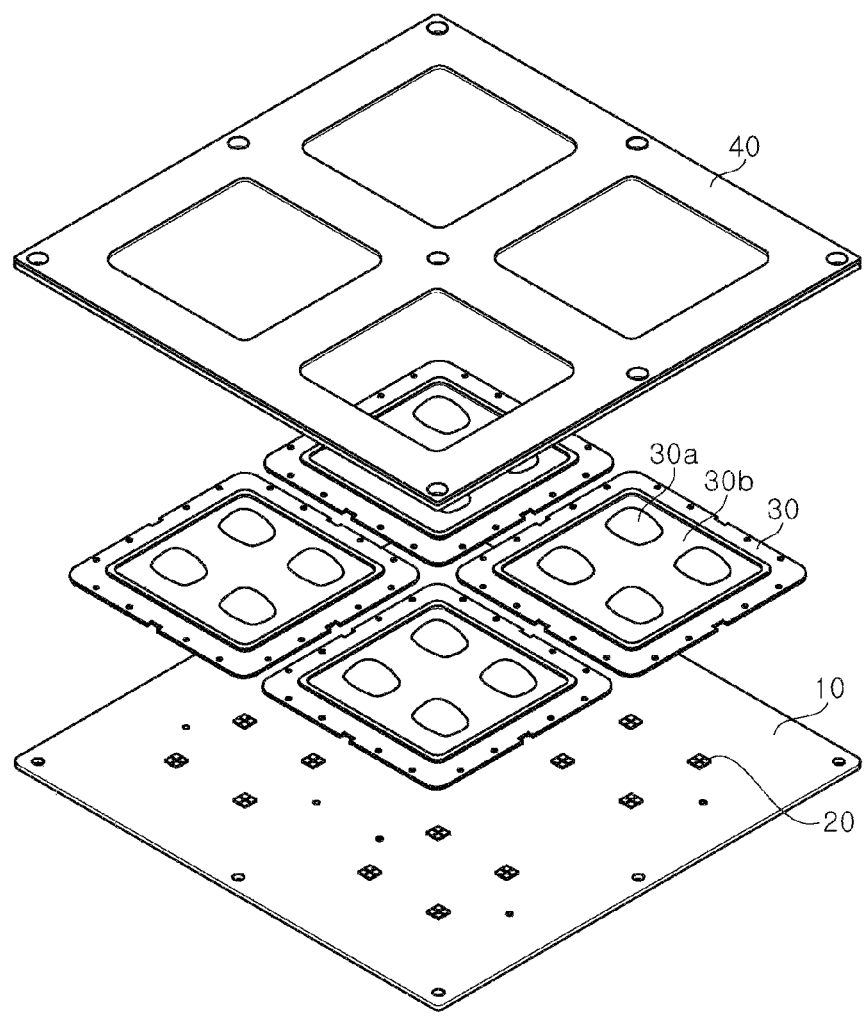
[FIG. 2]

【FIG. 3】
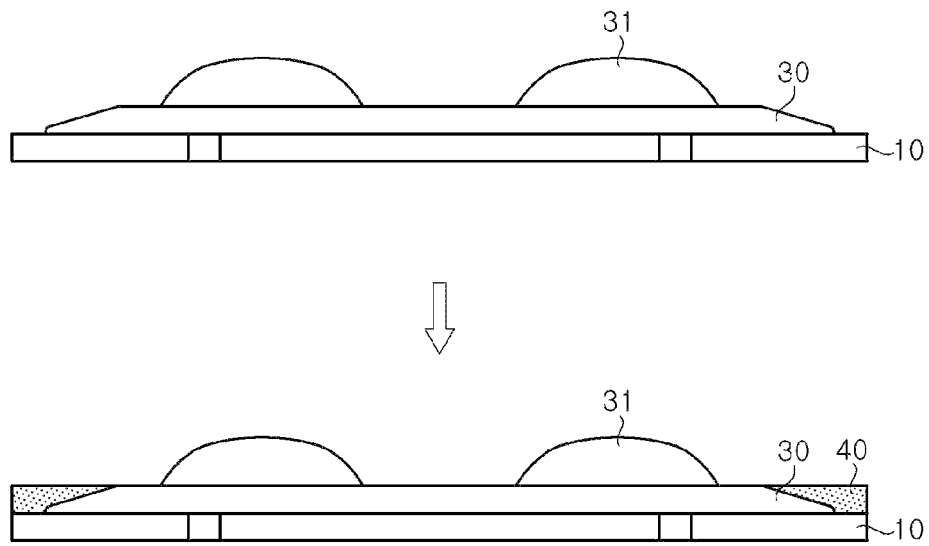
【FIG. 4A】
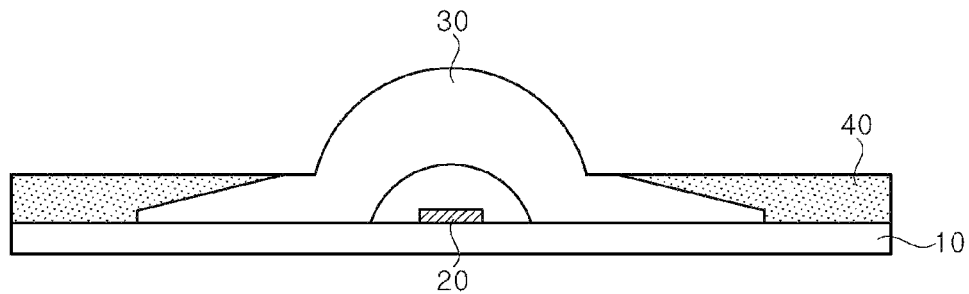
【FIG. 4B】
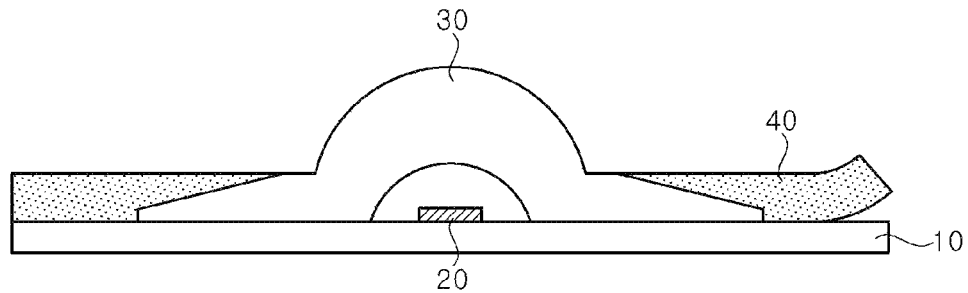

[FIG. 4C]
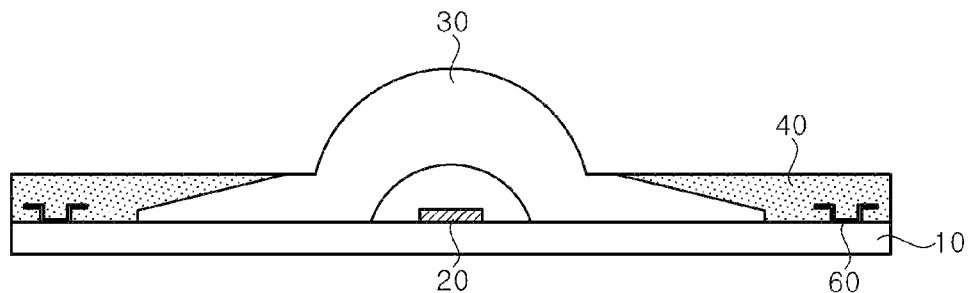
[FIG. 5A]
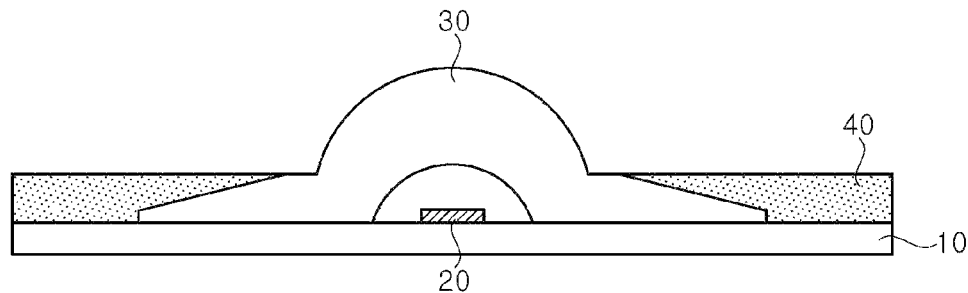
[FIG. 5B]
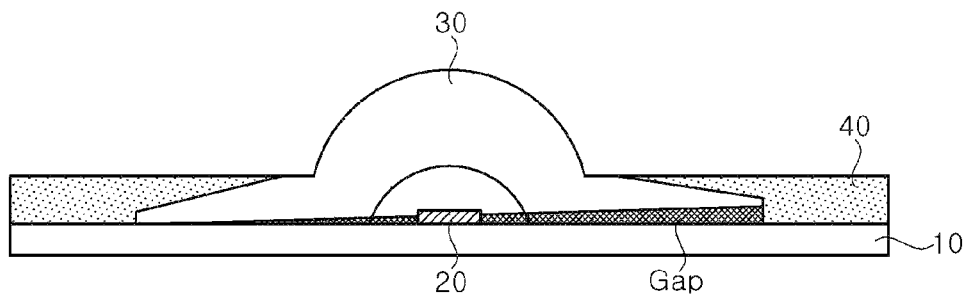
[FIG. 5C]
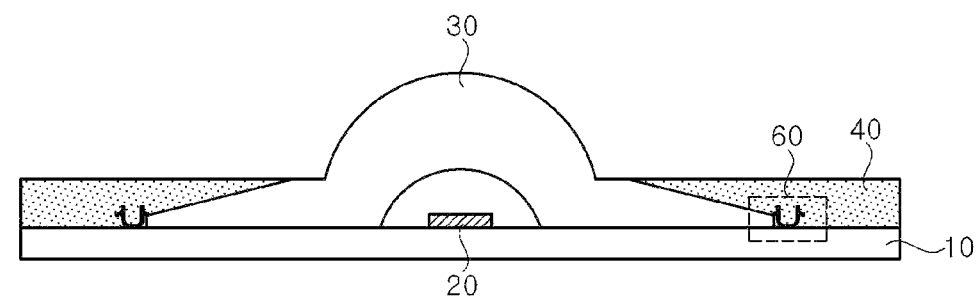

[FIG. 6]
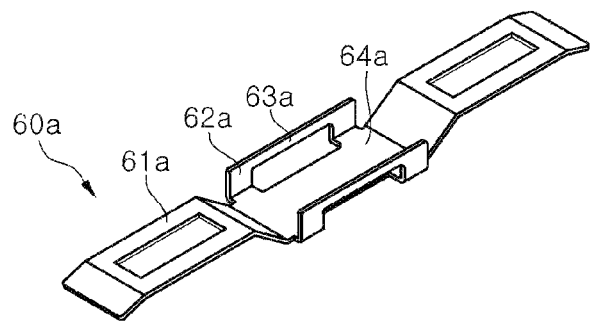
[FIG. 7]
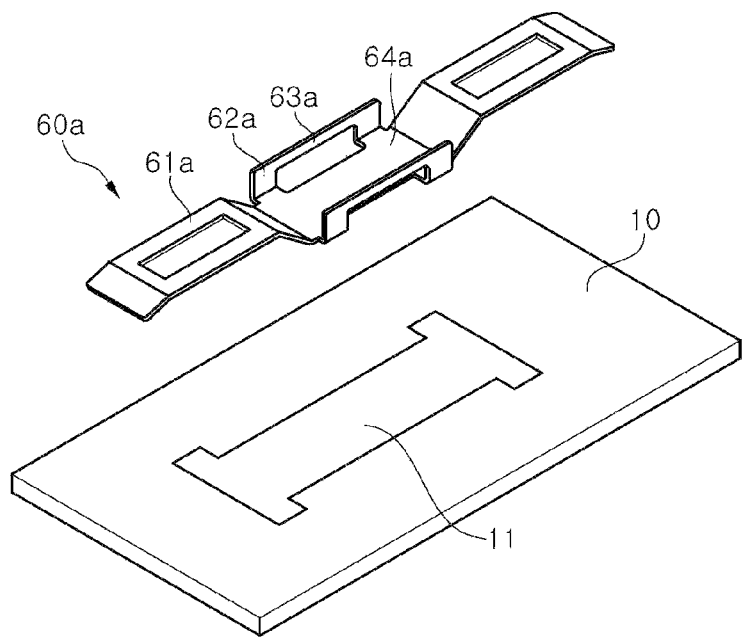

[FIG. 8]
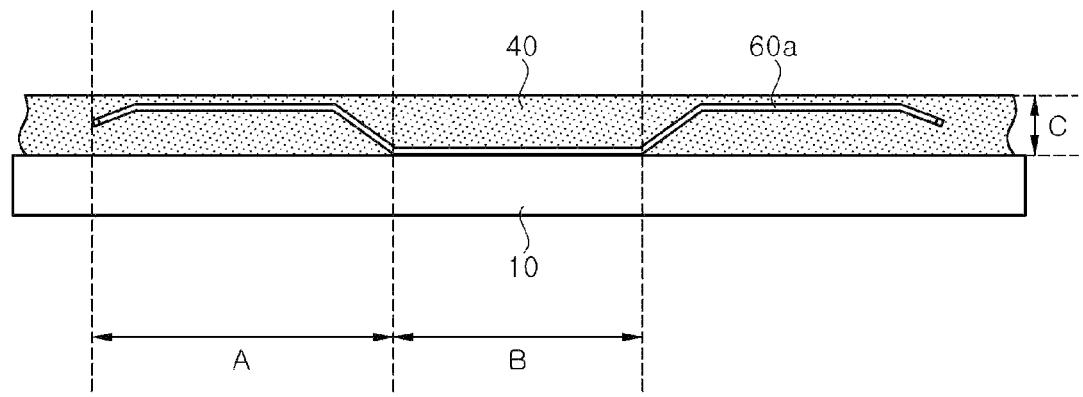
[FIG. 9]
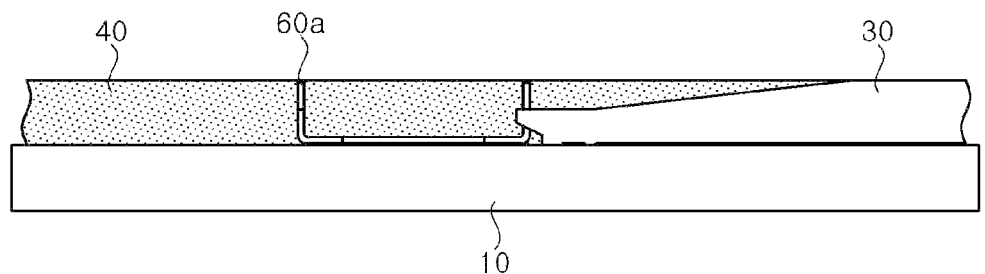
[FIG. 10A]
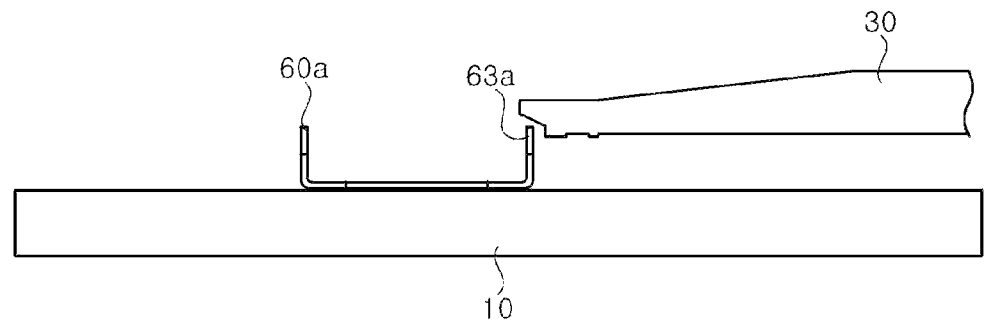

[FIG. 10B]
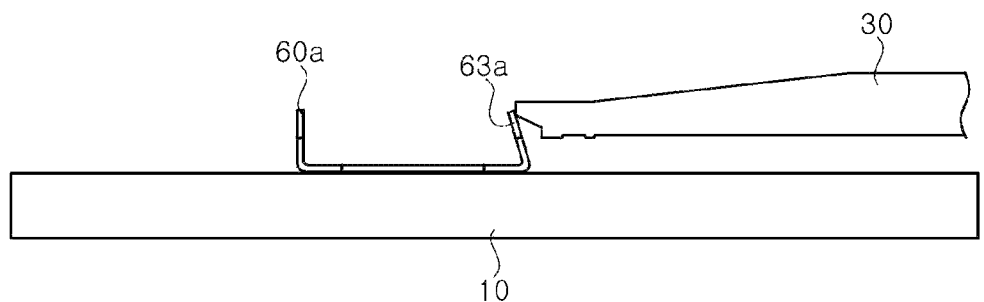
[FIG. 10C]
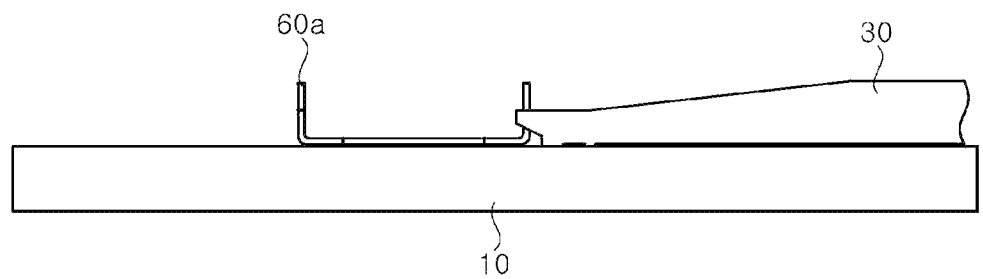
[FIG. 11]
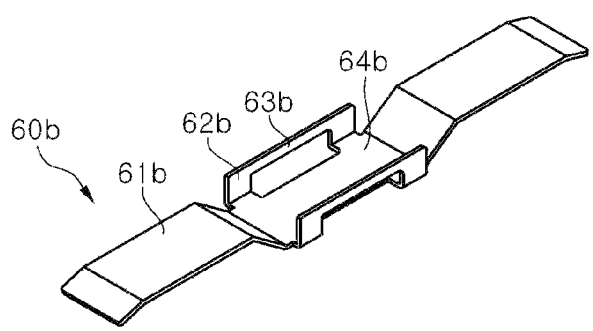

【FIG. 12】
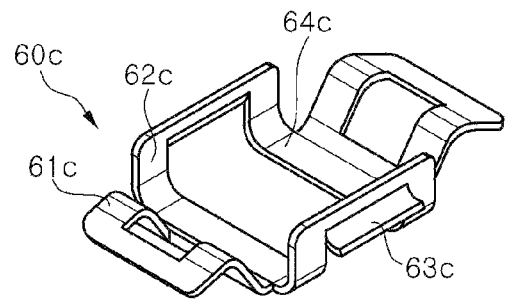
【FIG. 13A】
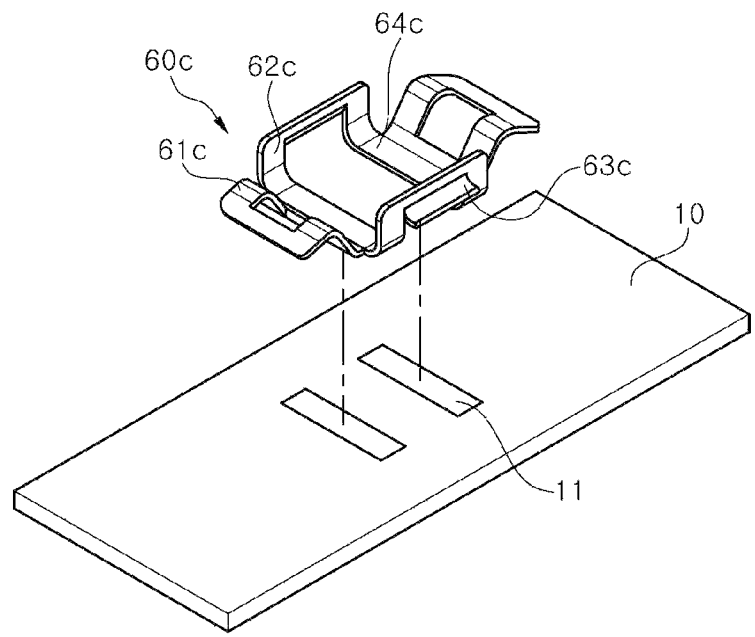
【FIG. 13B】
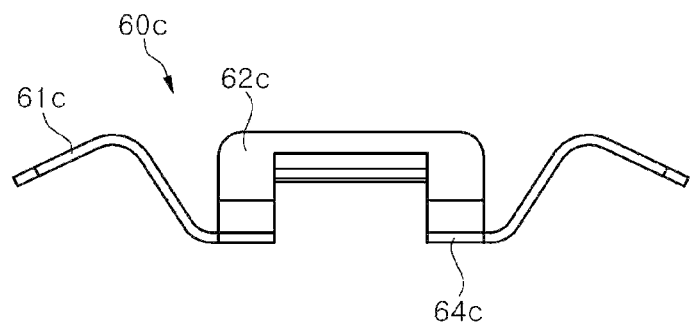

【FIG. 13C】
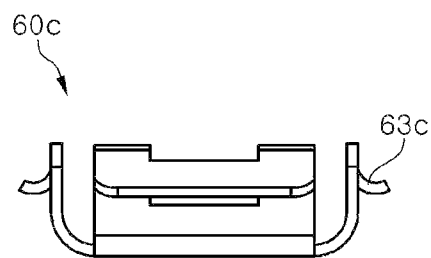
【FIG. 14】
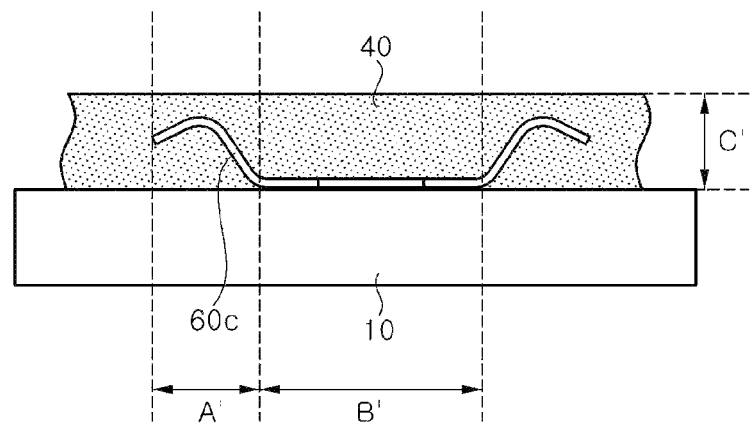
【FIG. 15】
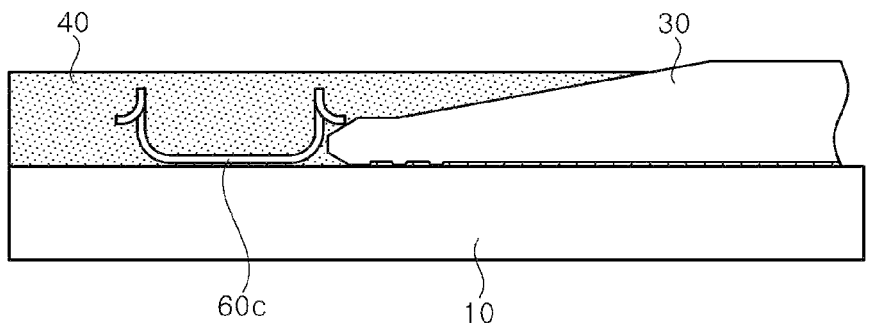

[FIG. 16A]
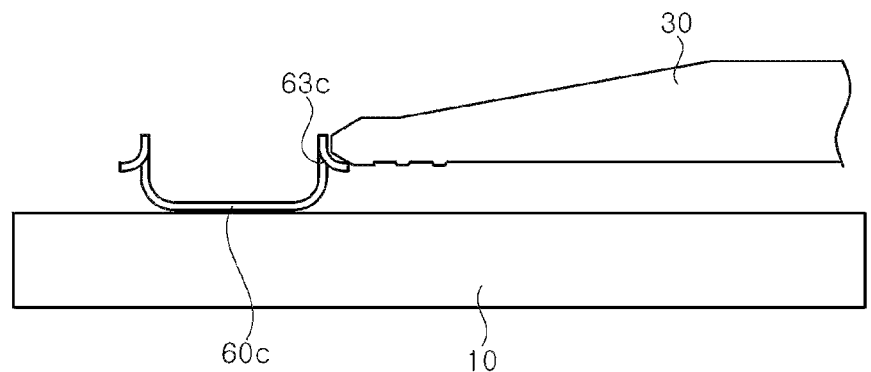
[FIG. 16B]
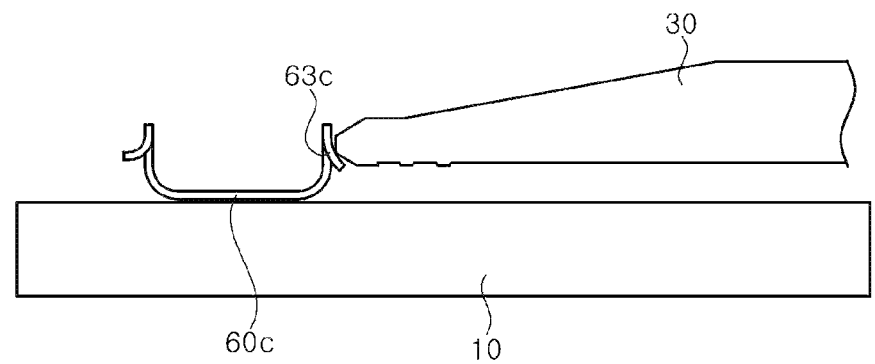
[FIG. 16C]
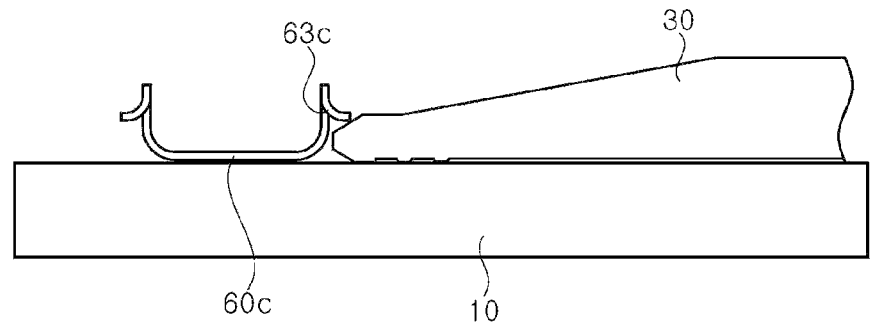

【FIG. 17】
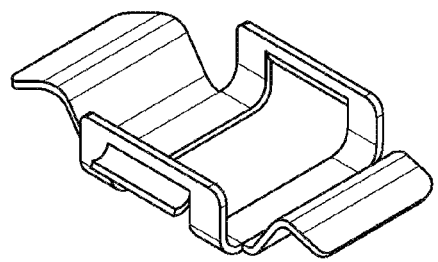
【FIG. 18A】
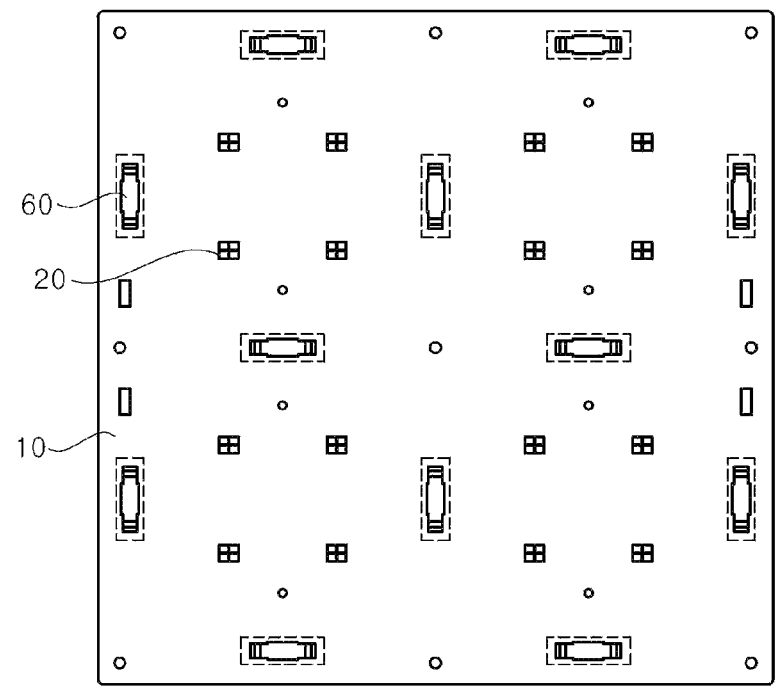

【FIG. 18B】
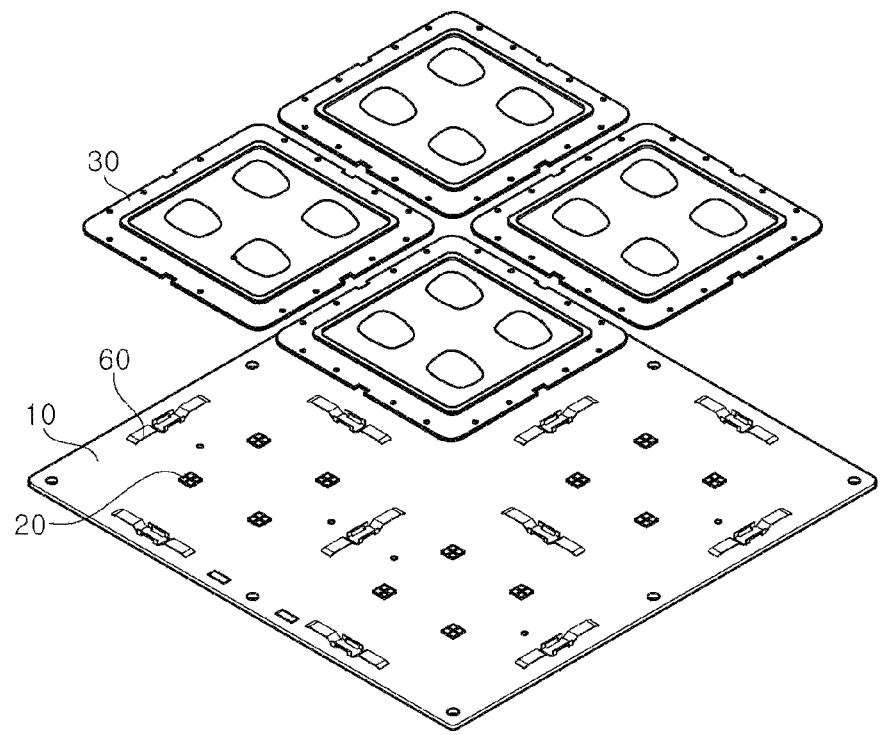
【FIG. 18C】
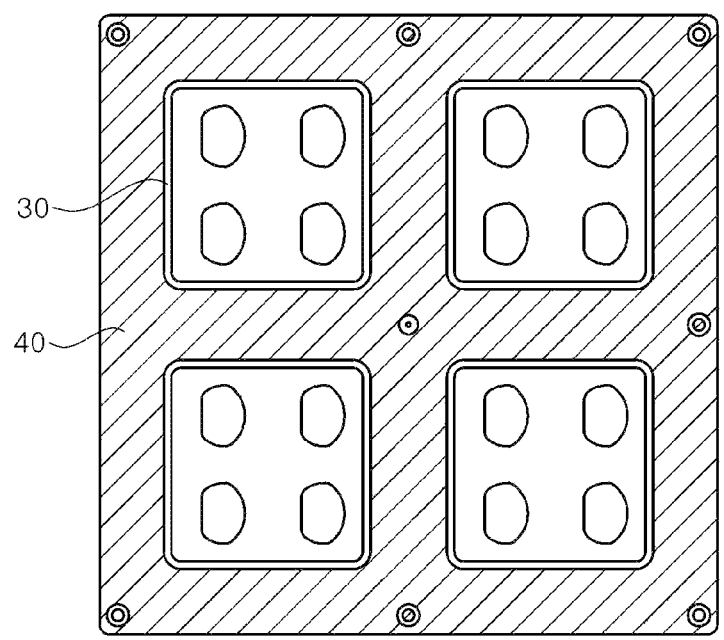

[FIG. 18D]
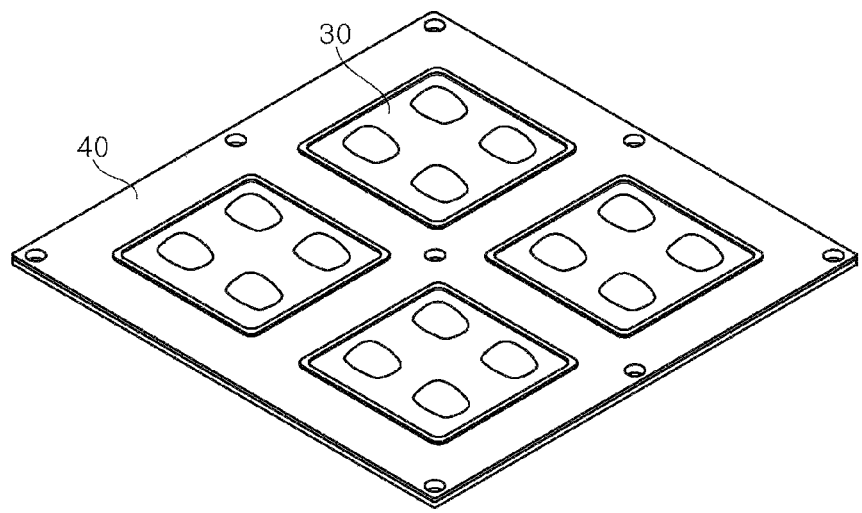
[FIG. 19A]
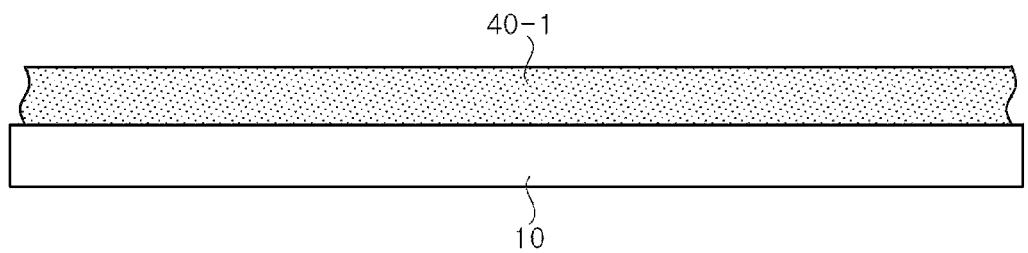
[FIG. 19B]
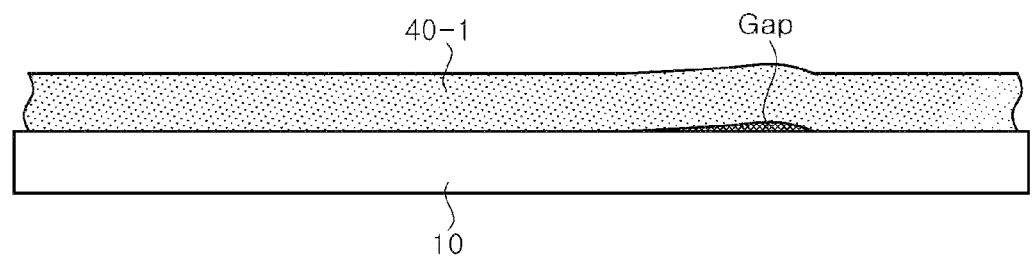

[FIG. 19C]
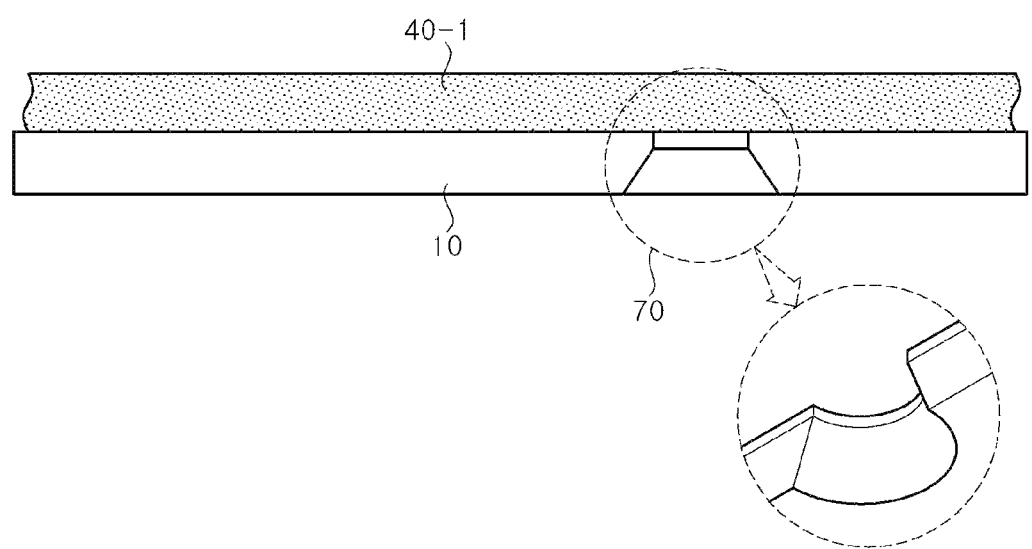

LENS MODULE

This patent document is a 371 National Phase Application of International Patent Application No. PCT/CN2020/123754, filed Oct. 26, 2020, which further claims priority to Chinese Patent Application No. 201911023036.0, filed Oct. 25, 2019. The entire contents of the above noted applications are incorporated by reference as part of the disclosure of this document.

TECHNICAL FIELD

The present disclosure relates to a lens module including a glue, and more particularly, to a lens module for preventing a glue or a lens from being detached from a substrate.

BACKGROUND ART

Light emitting diode (LED) has many advantages over conventional light sources. The light emitting diode has light directionality, is capable of controlling various colors, and is advantageous in controlling an amount of light depending on changes in voltage and current, compared to the conventional light sources.

The light emitting diode is a semiconductor light emitting device that emits light by a potential difference when electrons and holes recombine in a P-N semiconductor junction structure by an applied current. A light emitting apparatus using the light emitting diode has advantages such as eco-friendliness, low voltage, long lifespan, low price, and others.

Typically, an optical lens is attached to an upper end of a light emitting diode package through a glue or an adhesive sheet. Accordingly, when the glue is used, an arrangement location of the optical lens may be shifted due to a flow of the glue when the glue is cured. In addition, the glue and the adhesive sheet include an organic-based glue material such as acrylic, epoxy, or the like. The adhesive material may have reduced glue characteristics at high temperatures. Accordingly, there may be a drawback that the optical lens is detached from the light emitting diode package.

DETAILED DESCRIPTION OF THE DISCLOSURE

Technical Problem

Exemplary embodiments provide a lens module for preventing a glue or a lens from being detached from a substrate.

Technical Solution

A lens module according to an exemplary embodiment of the present disclosure includes a substrate having a plurality of light emitting regions, a light emitting devices provided in each of the plurality of light emitting regions to emit light, and a lens unit provided on the substrate to cover the light emitting devices, a glue contacting the substrate and the lens unit to secure the substrate and the lens unit, and a support member provided in the glue and mounted on the substrate. The support member may include a hump for increasing a contact area between the support member and the glue, and a clip connected to the lens unit.

In an exemplary embodiment of the present disclosure, the support member may comprise a metal sheet, and may further include a clip holder for supporting the clip, and a pad mounted on the substrate.

In an exemplary embodiment of the present disclosure, a hole may be provided in the hump.

In an exemplary embodiment of the present disclosure, the hump may be configured to have a length corresponding to a predetermined first ratio with respect to a length of the support member in contact with the substrate, or the hump may be configured to have a length corresponding to a predetermined second ratio with respect to a thickness of the glue.

In an exemplary embodiment of the present disclosure, the clip holder may have elasticity such that a shape thereof is deformed when an external force in a Z-axis direction perpendicular to the substrate is applied, the shape of the clip holder may be deformed such that the clip and an end of the lens unit are fastened, and thereafter, when the clip and the lens unit are fastened, the deformed shape of the clip holder may be restored.

In an exemplary embodiment of the present disclosure, the shape of the clip holder may be configured to correspond to a shape of the end of the lens unit, or a length of the clip holder may be configured to have a length corresponding to a predetermined third ratio with respect to a thickness of the end of the lens unit.

In an exemplary embodiment of the present disclosure, the clip may have elasticity such that a shape thereof is deformed when an external force in the Z-axis direction perpendicular to the substrate is applied, the shape of the clip may be deformed such that the support member secures the lens unit, and thereafter, when the lens unit is secured, the deformed shape of the clip holder may be restored.

In an exemplary embodiment of the present disclosure, the shape of the clip may be configured to correspond to the shape of the end of the lens unit, or a distance between the clip and the substrate may be configured in a predetermined fourth ratio with respect to the thickness of the end of the lens unit.

In an exemplary embodiment of the present disclosure, the lens module may include a plurality of support members of different types from one another determined in consideration of shapes of the substrate, the lens unit, and the glue.

In an exemplary embodiment of the present disclosure, the plurality of support members may include at least two support members among a first support member including a first hump having a first length and including a hole, a second support member including a second hump having the first length and not including the hole, a third support member including a third hump having a second length shorter than the first length and including the hole, and a fourth support member including a fourth hump having the second length and not including the hole.

Advantageous Effects

An exemplary embodiment of the present disclosure may prevent a glue included in a lens module from being detached from a substrate.

Another exemplary embodiment of the present disclosure may prevent a lens unit included in a lens module from being detached from a substrate.

BRIEF DESCRIPTIONS OF DRAWINGS

FIG. 1 is a perspective view illustrating a lens module according to an exemplary embodiment of the present disclosure.

FIG. 2 is an exploded perspective view of the lens module of FIG. 1.

FIG. 3 is a cross-sectional view illustrating a process in which a glue is included in the lens module according to an exemplary embodiment of the present disclosure.

FIGS. 4A through 4C are cross-sectional views illustrating an exemplary embodiment in which a support member is included in the lens module of the present disclosure.

FIGS. 5A through 5C are cross-sectional views illustrating another exemplary embodiment in which a support member is included in the lens module of the present disclosure.

FIG. 6 is a perspective view illustrating a support member according to a first exemplary embodiment of the present disclosure.

FIG. 7 is a perspective view illustrating the support member and the substrate together according to the first exemplary embodiment of the present disclosure.

FIG. 8 is a front view illustrating a state in which the support member according to the first exemplary embodiment of the present disclosure is mounted on the substrate.

FIG. 9 is a side view illustrating the state in which the support member according to the first exemplary embodiment of the present disclosure is mounted on the substrate.

FIGS. 10A through 10C are side views illustrating a process in which the support member is connected to the lens unit according to the first exemplary embodiment of the present disclosure.

FIG. 11 is a perspective view illustrating a support member according to a second exemplary embodiment of the present disclosure.

FIG. 12 is a perspective view illustrating a support member according to a third exemplary embodiment of the present disclosure.

FIG. 13A is a perspective view illustrating the support member and the substrate together according to the third exemplary embodiment of the present disclosure.

FIG. 13B is a front view illustrating the support member according to the third exemplary embodiment of the present disclosure.

FIG. 13C is a side view illustrating the support member according to the third exemplary embodiment of the present disclosure.

FIG. 14 is a front view illustrating a state in which the support member is mounted on the substrate according to the third exemplary embodiment of the present disclosure.

FIG. 15 is a side view illustrating the state in which the support member is mounted on the substrate according to the third exemplary embodiment of the present disclosure.

FIGS. 16A through 16C are side views illustrating a process in which the support member is connected to the lens unit according to the third exemplary embodiment of the present disclosure.

FIG. 17 is a perspective view illustrating a support member according to a fourth exemplary embodiment of the present disclosure.

FIGS. 18A through 18D are diagrams illustrating a process of designing a lens module according to an exemplary embodiment of the present disclosure.

FIGS. 19A through 19C are cross-sectional views illustrating an exemplary embodiment in which a support member is implemented on the substrate of the present disclosure.

BEST MODE

Since the present invention can have various changes and can have various forms, specific exemplary embodiments are illustrated in the drawings and described in detail in the specification. However, it is not intended to limit the present invention to the specific disclosed form, it should be understood that it includes all modifications, equivalents and substitutes included in the spirit and scope of the present invention.

Hereinafter, preferred exemplary embodiments of the present invention will be described in more detail with reference to the accompanying drawings.

FIG. 1 is a perspective view illustrating a lens module according to an exemplary embodiment of the present disclosure, and FIG. 2 is an exploded perspective view of the lens module of FIG. 1.

Referring to FIG. 1 and FIG. 2, a lens module 100 according to an exemplary embodiment of the present disclosure includes a substrate 10, a light emitting device 20, a lens unit 30, a glue 40, and a fastening member 50.

The substrate 10 is provided for mounting one or more light emitting devices 20 thereon. A light emitting region which the light emitting device 20 is mounted on and light is emitted through is provided on the substrate 10, and one or more light emitting devices 20 may be provided for each light emitting region.

In the exemplary embodiment of the present disclosure, a plurality of light emitting regions may be provided on an upper surface of the substrate 10, and thus, a size of the lens module 100 and an amount of light may be determined. For example, the light emitting regions may be arranged in a 2×2 matrix shape. However, this is only an example, and the light emitting region may be arranged in various shapes such as 3×4, 2×6, or others.

The substrate 10 may be provided in various shapes. For example, the substrate 10 may have a quadrangular shape in plan view, which is provided in a shape of a plate having a predetermined height. However, the shape of the substrate 10 is not limited thereto, and may be provided in an elliptical or circular shape.

The substrate 10 is provided with interconnections and a terminal for providing power to the light emitting device 20. In an exemplary embodiment of the present disclosure, the substrate 10 may be a printed circuit board. However, a type of the substrate 10 is not limited thereto, and may be formed of various materials and various shapes.

For example, at least a portion of the substrate 10 may consist of a material having high thermal conductivity. The substrate 10 may include, for example, a metal such as copper, iron, nickel, chromium, aluminum, silver, gold, titanium, or an alloy thereof. Alternatively, the substrate 10 may include a non-conductive material such as a ceramic, a polymer resin, glass, or a composite material thereof (e.g., a composite resin or a mixture of a composite resin and a conductive material).

In an exemplary embodiment of the present disclosure, the light emitting device 20 may emit light upwards from the substrate 10. For example, the light emitting device 20 may emit light radially from the surface of the substrate 10. In this case, the light emitting device 20 may emit light uniformly and isotropically with respect to all angles. However, a light exiting direction of the light emitting device 20 according to the exemplary embodiment of the present disclosure is not limited thereto. For example, the light exiting direction of the light emitting device 20 may be limited within a certain angle, and in this case, light may be anisotropically emitted along a predetermined direction. Accordingly, when light with directionality in a specific direction is required, light emission in the specific direction may be easily implemented by using the light emitting device 20 that anisotropically emits light.

In an exemplary embodiment of the present disclosure, the light emitting device 20 may be implemented with light emitting diode chips. Although not shown, the light emitting device 20 may include a light emitting structure and an electrode portion.

The light emitting structure may include a first conductivity type semiconductor layer, an active layer, and a second conductivity type semiconductor layer sequentially provided.

The first conductivity type semiconductor layer is a semiconductor layer doped with a first conductivity type dopant. The first conductivity type dopant may be an n-type dopant. The first conductivity type dopant may be Si, Ge, Se, Te or C. In an exemplary embodiment of the present disclosure, the first conductivity type semiconductor layer may include a nitride-based semiconductor material. For example, the first conductivity type semiconductor layer may consist of a semiconductor material having a compositional formula of $In_xAl_yGa_{1-x-y}N$ ($0 \leq x \leq 1$, $0 \leq y \leq 1$, $0 \leq x y \leq 1$). The active layer is provided on the first conductivity type semiconductor layer and corresponds to the light emitting layer.

The active layer is a layer in which electrons (or holes) injected through the first conductivity type semiconductor layer and holes (or electrons) injected through the second conductivity type semiconductor layer meet each other, and light is emitted due to a difference in band gaps of energy bands depending on a material forming the active layer. The active layer may emit light of at least one peak wavelength of ultraviolet, blue, green, and red. The active layer may be implemented with a compound semiconductor. The active layer may be implemented, for example, by at least one of group III-V or group II-VI compound semiconductors, and may be formed of a material having a compositional formula of InxAlyGa1−x−yN ($0 \leq x \leq 1$, $0 \leq y \leq 1$, $0 \leq x+y \leq 1$).

The second conductivity type semiconductor layer is provided on the active layer. The second conductivity type semiconductor layer is a semiconductor layer having a second conductivity type dopant having a polarity opposite to that of the first conductivity type dopant. The second conductivity type dopant may be a p-type dopant, and the second conductivity type dopant may include, for example, Mg, Zn, Ca, Sr, Ba, or the like. In an exemplary embodiment of the present disclosure, the second conductivity type semiconductor layer may include a nitride-based semiconductor material. The second conductivity type semiconductor layer may consist of a semiconductor material having a composition formula of $In_xAl_yGa_{1-x-y}N$ ($0 \leq x \leq 1$, $0 \leq y \leq 1$, $0 \leq x y \leq 1$).

In an exemplary embodiment of the present disclosure, a cathode connected to the first conductivity type semiconductor layer and an anode connected to the second conductivity type semiconductor layer are provided on the first conductivity type semiconductor layer and the second conductivity type semiconductor layer, respectively, and the cathode and the anode may receive power by being connected to the interconnections or the terminal of the substrate 10.

Referring to FIG. 1 and FIG. 2, the lens module 100 includes the lens unit 30 that covers the light emitting device 20. The lens unit 30 may protect the light emitting device 20, and may also be used as an optical element that simply transmits light emitted from the light emitting device 20 or guides it in a predetermined direction.

The lens unit 30 may be provided in various shapes in plan view. For example, the lens unit 30 may be provided in a rectangular shape. However, the shape of the lens unit 30 is not limited thereto, and may be provided in another polygonal or oval shape.

The lens unit 30 may correspond to the shape of the light emitting region on the substrate 10 on which the light emitting device 20 is disposed, and may include a lens unit 30a at least partially formed of a curved surface and a flat portion 30b provided around the lens 30a and having an upper surface parallel to the surface of the substrate 10.

In FIG. 1 and FIG. 2, although each of the lens units 30 is illustrated as including four lens 30a, the inventive concepts are not limited thereto, but the lens unit 30 may include various numbers of lens 30a depending on design specifications.

The lens 30a may have an elliptical shape protruding upwards. The flat portion 30b may be provided around the lens 30a in a plate shape substantially parallel to the surface of the substrate 10. However, the shape of the lens 30a is not limited thereto, and other shapes may be provided depending on a light exiting efficiency and a light exiting direction.

In addition, the upper surface of the flat portion 30b may be provided substantially parallel to the upper surface of the substrate 10. However, this is only an example, and to facilitate fastening with other elements, the flat portion 30b may be provided as having a partially parallel and partially inclined surface. In an exemplary embodiment of the present disclosure, the lens 30a and the flat portion 30b may be integrally formed without being separated.

The lens 30a may be provided with various materials satisfying the above-described functions, but the materials are not limited thereto. For example, the lens 30a may consist of quartz or a polymer organic material. Herein, in a case of a polymer organic material, since a wavelength of light to be absorbed/transmitted is different depending on types of a monomer, a molding method, and a condition, the polymer organic material may be selected in consideration of a wavelength of light emitted from the light emitting device 20. For example, an organic polymer such as poly (methylmethacrylate) (PMMA), polyvinylalcohol (PVA), polypropylene (PP), low-density polyethylene (PE), and the like may hardly absorb UV light, but an organic polymer such as polyester may absorb UV light.

Referring to FIG. 1 and FIG. 2, the lens module 100 includes the glue 40 for securing the lens unit 30 to the substrate 10. The glue 40 may be implemented as a sealing glue or a plastic type.

For example, the glue 40 may include at least one of an acrylic glue, a silicone glue, a urethane glue, a polyvinyl butyral glue (PMB), an ethylene-vinyl acetate glue (EVA), polyvinyl ether, saturated amorphous polyester, and melamine resin.

Referring to FIG. 1 and FIG. 2, the lens module 100 includes the fastening member 50 connecting the substrate 10 and the glue 40. In an exemplary embodiment of the present disclosure, the substrate 10 and the glue 40 may be firmly connected by fastening a screw in the fastening member 50.

FIG. 3 is a cross-sectional view illustrating a process in which the glue is included in the lens module according to an exemplary embodiment of the present disclosure.

Referring to FIGS. 1 through 3, the lens module 100 includes a lens 31 having an elliptical spherical shape protruding upwards, the lens unit 30 including the lens 31, and the substrate 10.

The glue 40 may be disposed in contact with each of the substrate 10 and the lens unit 30 so as to secure the lens unit 30 on the substrate 10.

The present disclosure relates to a technique for securing a lens to a substrate (e.g., PCB) using a glue when a lens module is produced, in which adhesion between the glue and the substrate is determined by a contact area between the glue and the substrate or a roughness of a contact surface.

For example, when the contact area between the glue and the substrate is small, the glue may be detached from the substrate, and a method is suggested in the present disclosure that a support member is included in the glue so as to increase the adhesion between the glue and the substrate.

Herein, the support member may comprise a metal sheet, and the metal sheet may increase the contact area between the glue and the substrate. A surface of the metal sheet may have a roughness equal to or greater than a certain value so as to increase the adhesion.

In addition, when the thickness of the glue is small, the lens may be detached from the substrate because the adhesion between the glue and the substrate is not sufficient. Even in this case, a metal sheet may be included in the glue so as to increase the adhesion between the glue and the substrate.

According to an exemplary embodiment, some portions of the metal sheet may have elasticity, and one end of the metal sheet may contact the lens. According to an exemplary embodiment, the lens is secured by applying a force in the Z-axis direction to the end of the lens in contact with some portions of the metal sheet, and thus, it is possible to prevent the lens from being detached from the substrate.

FIGS. 4A through 4C are cross-sectional views illustrating an exemplary embodiment in which a support member is included in the lens module of the present disclosure.

Referring to FIGS. 1 through 4A, the lens module includes the substrate 10, the light emitting device 20 disposed on the substrate 10, the lens unit 30 covering the light emitting device 20, and the glue 40 that is adhered to the substrate 10 and the lens unit 30 and firmly connects the substrate 10 and the lens unit 30.

According to an exemplary embodiment, after the glue 40 is solidified, the substrate 10 and the lens unit 30 may be secured by the adhesion of the glue 40, and the lens module may be waterproofed.

As shown in FIG. 4B, when the contact area between the substrate 10 and the glue 40 is reduced, the adhesion between the substrate 10 and the glue 40 may be decreased. In particular, there is a high possibility that the adhesion between the substrate 10 and the glue 40 at an edge of the substrate 10 is reduced.

When the adhesion between the glue 40 and the substrate 10 is reduced and the glue 40 is detached (or peeled off) from the substrate 10, the waterproof performance of the lens module may also be affected.

In this case, to prevent the glue 40 from being detached from (or peeled off) from the substrate 10, a method is suggested in the present disclosure that a support member 60 is included in the glue 40 as shown in FIG. 4C. The support member 60 may be a metal sheet, and the metal sheet may be implemented so as to increase the contact area between the glue 40 and the substrate 10 or so as to increase a roughness. Through this, the support member 60 may prevent the glue 40 from being detached from the substrate 10.

In this case, the support member 60 may be mounted on the substrate 10 in a surface mount technology (SMT) process. The support member 60 may be implemented in various shapes so as to prevent the glue 40 from being loosened or peeled off from the substrate 10.

The shape of the support member 60 shown in FIG. 4C is only one form for solving a technical problem of the present application, and the inventive concepts are not limited to the shape of the support member 60 shown in FIG. 4C, but the support member 60 may be implemented in various forms.

In addition, the support member 60 is not limited to only a metal sheet, but may be implemented with other materials capable of firmly connecting the glue 40 and the substrate 10.

FIGS. 5A through 5C are cross-sectional views illustrating another exemplary embodiment in which a support member is included in the lens module of the present disclosure.

Referring to FIGS. 1 through 5A, the lens module includes the substrate 10, the light emitting device 20 disposed on the substrate 10, the lens unit 30 covering the light emitting device 20, and the glue 40 that is adhered to the substrate 10 and the lens unit 30 and firmly connects the substrate 10 and the lens unit 30. Herein, the lens unit 30 may be secured by a pressure of the glue 40.

In FIG. 5B, when an external force is applied in a direction to weaken the connection between the lens unit 30 and the substrate 10, a portion of a contact surface of the lens unit 30 may be detached from the substrate 10, thereby creating a gap between the lens unit 30 and the substrate 10. In this case, since the contact area between the lens unit 30 and the glue 40 is reduced, the adhesion between the lens unit 30 and the glue 40 may be decreased.

In the present disclosure, as shown in FIG. 5B, to prevent the lens unit 30 from being detached from the substrate 10, a method is suggested in the present disclosure that the support member 60 is included in the glue 40 as shown in FIG. 5C.

In this case, the support member 60 may be mounted on the substrate 10 in a surface mount technology (SMT) process. The support member 60 may be implemented in various shapes so as to prevent the lens unit 30 from being loosened or peeled off from the substrate 10.

The shape of the support member 60 shown in FIG. 5C is only one form for solving a technical problem of the present application, and the inventive concepts are not limited to the shape of the support member 60 shown in FIG. 5C, but the support member 60 may be implemented in various forms.

The support member 60 may be implemented as a metal sheet, and the support member 60 may be implemented so as to secure the lens unit 30 by applying pressure to one end of the lens unit 30 in the Z-axis direction while in contact with one end of the lens unit 30. Accordingly, it is possible to prevent the lens unit 30 from being detached from the substrate 10.

In addition, the support member 60 is not limited to only a metal sheet, but may be implemented with other materials capable of firmly connecting the lens unit 30 and the substrate 10.

FIG. 6 is a perspective view illustrating a support member according to a first exemplary embodiment of the present disclosure, and FIG. 7 is a perspective view illustrating the support member and the substrate together according to the first exemplary embodiment of the present disclosure.

Referring to FIG. 6, a support member 60a according to the first exemplary embodiment of the present disclosure may be implemented as a metal sheet. The support member 60a may include a hump 61a, a clip holder 62a, a clip 63a, and a pad 64a.

According to an exemplary embodiment, the hump 61a may be set so as to maximize a contact area between the support member 60a included in the lens module and the glue 40. According to an exemplary embodiment, the hump 61a may be implemented such that the contact area between the support member 60a and the glue 40 is equal to or greater than a predetermined area. The hump 61a may be formed to extend from both sides (or one side) of the pad 64a, which will be described in more detail later, and may be formed to have a shape partially protruding in the Z-axis direction, which is a direction perpendicular to the substrate. Since the hump 61a is formed by extending the pad 64a, it also corresponds to an extended portion.

In addition, to increase the contact area between the support member 60a and the glue, the hump 61a may be implemented so as to include a hole. In this case, since the glue is inserted into the hole in the hump 61a, the contact area between the support member 60a and the glue may be increased.

The clip holder 62a may be configured to support the clip 63a, and the clip 63a may be used so as to connect the lens unit included in the lens module and the support member 60a.

Referring to FIG. 6 and FIG. 7, the pad 64a of the support member 60a is disposed on a pad region 11 on the substrate 10, and thus, the support member 60a may be mounted on the substrate 10.

FIG. 8 is a front view illustrating a state in which the support member according to the first exemplary embodiment of the present disclosure is mounted on the substrate, and FIG. 9 is a side view illustrating the state in which the support member according to the first exemplary embodiment of the present disclosure is mounted on the substrate.

Referring to FIGS. 6 through 8, the support member 60a may be included in the glue 40 and may be mounted on the substrate 10. The support member 60a may be implemented in various shapes such that the glue 40 and the substrate 10 are firmly connected to each other.

The pad 64a of the support member 60a may be secured on the pad region 11 on the substrate 10 by a surface mount technology (SMT) process.

According to an exemplary embodiment, a length "A" of the hump 61a of the support member 60a may be longer than a length "B" of a body of the support member 60a in contact with the substrate 10.

When the length A of the hump 61a is implemented to be longer than the length B of the body of the support member 60a, there is an effect that the adhesion between the support member 60a and the glue may be increased by increasing the contact area between the support member 60a and the glue.

In addition, when the length A of the hump 61a is implemented to be longer than the length B of the body of the support member 60a, there is an effect that the adhesion between the support member 60a and the glue may be increased by increasing a roughness of the contact surface between the support member 60a and the glue.

According to an exemplary embodiment, the length A of the hump 61a may be implemented to be longer than a thickness C of the glue 40.

When the length A of the hump 61a is implemented to be longer than the thickness C of the glue 40, there is an effect that a supporting force of the support member 60a for the glue 40 may be increased.

Referring to FIGS. 6 through 9, the support member 60a may be coupled to the end of the lens unit 30 through the clip 63a implemented in the support member 60a. A process in which the support member 60a is fastened to the end of the lens unit 30 is specifically illustrated in FIGS. 10A through 10C.

FIGS. 10A through 10C are side views illustrating a process in which the support member is connected to the lens unit according to the first exemplary embodiment of the present disclosure.

Referring to FIGS. 6 through 10A, the clip holder 62a supporting the clip 63a in the support member 60a may have elasticity, and may be formed so as to receive a force in the Z-axis direction. According to an exemplary embodiment, a shape and a size of the clip holder 62a of the support member 60a may be adjusted depending on a shape and a size of the end of the lens unit 30.

When the clip holder 62a supporting the clip 63a has elasticity, the clip 63a and the end of the lens unit 30 may be more easily fastened, and a force required for fastening may be reduced.

In addition, when the shape and the size of the clip holder 62a of the support member 60a are adjusted depending on the shape and the size of the end of the lens unit 30, there is an effect that the force required for fastening the clip 63a and the end of the lens unit 30 may be reduced and a power consumption during the process may be reduced.

According to an exemplary embodiment, a shape of a fastening hole of the clip holder 62a may be formed so as to correspond to the end of the lens unit 30 to which it is fastened. According to an exemplary embodiment, a size of the fastening hole of the clip holder 62a may be formed so as to correspond to a thickness of the end of the lens unit 30 to which it is fastened.

When the size of the fastening hole of the clip holder 62a is formed to have the size corresponding to the thickness of the end of the lens unit 30 to which it is fastened, there is an effect that the end of the clip 63a and the lens unit 30 may be more easily fastened.

Referring to FIGS. 6 through 10B, when an external force in the Z-axis direction is applied such that the clip 63a of the support member 60a is fastened to the end of the lens unit 30, the shape of the clip holder 62a having elasticity may be deformed.

Referring to FIGS. 6 through 10C, when the clip 63a of the support member 60a is fastened to the end of the lens unit 30, the clip holder 62a may be restored to its original shape.

FIG. 11 is a perspective view illustrating a support member according to a second exemplary embodiment of the present disclosure.

Referring to FIG. 11, a support member 60b according to the second exemplary embodiment of the present disclosure may be implemented as a metal sheet. The support member 60b may include a hump 61b, a clip holder 62b, a clip 63b, and a pad 64b.

The hump 61b according to the second exemplary embodiment of the present disclosure may be implemented with a predetermined length so as to increase a contact area between the support member 60b included in the lens module and the glue 40.

However, unlike the support member 60a according to the first exemplary embodiment of the present disclosure shown in FIG. 6, the hump 61b in the support member 60b according to the second exemplary embodiment of the present disclosure shown in FIG. 11 is implemented not to include a hole. In this case, since the hump 61b does not include a hole, there is an effect that a process of manufacturing the support member 60b may be further simplified.

Since the support member 60*b* according to the second exemplary embodiment of the present disclosure does not have the hole in the hump 61*b*, there is an effect that the support member 60*b* may be manufactured more easily. In addition, although the hole is not provided in the hump 61*b*, when the hump 61*b* is implemented such that a roughness of a surface in contact with the glue is equal to or greater than a predetermined threshold, there is an effect that a frictional force between the hump 61*b* and the glue may be increased and the support member 60*b* may more firmly support the glue.

FIG. 12 is a perspective view illustrating a support member according to a third exemplary embodiment of the present disclosure. FIG. 13A is a perspective view illustrating the support member and the substrate together according to the third exemplary embodiment of the present disclosure, FIG. 13B is a front view illustrating the support member according to the third exemplary embodiment of the present disclosure, and FIG. 13C is a side view illustrating the support member according to the third exemplary embodiment of the present disclosure.

Referring to FIG. 12 and FIG. 13A, a support member 60*c* according to the third exemplary embodiment of the present disclosure may be implemented as a metal sheet. The support member 60*c* may include a hump 61*c*, a clip holder 62*c*, a clip 63*c*, and a pad 64*c*.

Since a length of the hump 61*c* is configured not to be lengthy, it is possible to install the support member 60*c* according to the third exemplary embodiment of the present disclosure in a small area within the lens module.

The support member 60*a* according to the first exemplary embodiment of the present disclosure and the support member 60*b* according to the second exemplary embodiment of the present disclosure are configured to have the lengthy hump so as to increase the contact area between the support member and the glue, while the support member 60*c* according to the third exemplary embodiment of the present disclosure is configured to a narrow hump 61*c* such that the support member is implemented in the glue even when a width of the glue or the substrate is narrow.

When the support member 60*c* includes the narrow hump 61*c*, there is an effect that the support member 60*c* may be easily installed even on an edge portion of the substrate to which the glue is attached. In addition, when the lens module includes a large lens unit, there is an effect that the support member 60*c* having the narrow hump 61*c* may be mounted in the lens module to increase a light emission function of the lens module.

In addition, by mounting a plurality of support members 60*c* having narrow humps 61*c* in the lens module, there is an effect that a greater support force may be secured compared to other types of support members.

According to an exemplary embodiment, a length of the hump 61*c* may be set to a length corresponding to a predetermined ratio to the width of the substrate. According to another exemplary embodiment, the length of the hump 61*c* may be set to a length corresponding to a predetermined ratio to the thickness of the glue.

However, to increase the contact area between the support member 60*c* and the glue, the hump 61*c* may be implemented so as to include a hole. In this case, since the glue is inserted into the hole in the hump 61*c*, the contact area between the support member 60*c* and the glue may be increased.

Referring to FIGS. 12 through 13B, the pad 64*c* of the support member 60*c* may be configured to be disposed on the pad region 11 on the substrate 10. The pad 64*c* of the support member 60*c* may be mounted on the pad region 11 on the substrate 10, and the support member 60*c* may be connected to the substrate 10.

Referring to FIGS. 12 through 13C, the clip 63*c* of the support member 60*c* may be configured to secure the lens unit included in the lens module. The clip 63*c* of the support member 60*c* may be fastened to the end of the lens unit, and the support member 60*c* may be connected to the lens unit.

FIG. 14 is a front view illustrating a state in which the support member is mounted on the substrate according to the third exemplary embodiment of the present disclosure, and FIG. 15 is a side view illustrating the state in which the support member is mounted on the substrate according to the third exemplary embodiment of the present disclosure.

Referring to FIGS. 12 through 14, the support member 60*c* is included in the glue 40 and may be mounted on the substrate 10. The support member 60*c* may be implemented in various forms such that the glue 40 and the substrate 10 are firmly connected to each other.

The pad 64*c* of the support member 60*c* may be secured on the pad region 11 on the substrate 10 by a surface mount technology (SMT) process.

According to an exemplary embodiment, a length A' of the hump 61*c* of the support member 60*c* may be implemented as short as a predetermined ratio compared to a length B' of a body of the support member 60*c* in contact with the substrate 10.

Although the length A' of the hump 61*c* is shorter than the length B' of the body of the support member 60*c*, by implementing the hump 61*c* in a curved shape, the contact area between the support member 60*c* and the glue is increased, and thus, there is an effect that the adhesion between the support member 60*c* and the glue 40 may be improved.

In addition, although the length A' of the hump 61*c* is implemented to be shorter than the length B' of the body of the support member 60*c*, by implementing the hump 61*c* in the curved shape, a roughness of the contact surface between the support member 60*c* and the glue 40 is increased, and thus, there is an effect that the adhesion between the support member 60*c* and the glue 40 may be improved.

According to an exemplary embodiment, the length A' of the hump 61*c* may be implemented as short as a predetermined ratio compared to a thickness C' of the glue 40.

Although the length A' of the hump 61*c* is implemented to be shorter than the thickness C' of the glue 40, there is an effect that a supporting force of the support member 60*c* for the glue 40 may be increased by implementing the hump 61*c* in the curved shape.

Referring to FIGS. 12 through 15, the support member 60*c* may firmly secure the lens unit 30 using the clip 63*c* implemented in the support member 60*c*. A process in which the support member 60*c* firmly secures the lens unit 30 is specifically illustrated in FIGS. 16A through 16C.

FIGS. 16A through 16C are side views illustrating a process in which the support member is connected to the lens unit according to the third exemplary embodiment of the present disclosure.

Referring to FIGS. 12 through 16A, the clip 63*c* of the support member 60*c* may have elasticity, and may be formed so as to apply a force in the Z-axis direction. A shape and a size of the clip 63*c* of the support member 60*c* may be adjusted depending on the shape and the size of the end of the lens unit 30.

For example, the shape of the clip 63*c* may be formed to correspond to the end of the lens unit 30 to be secured. For example, a height of the clip 63*c* (i.e., a distance from the substrate 10 to the clip 63c) may be set at a predetermined ratio compared to the thickness of the end of the lens unit 30 to be secured.

Referring to FIGS. 12 through 16B, when an external force in the Z-axis direction is applied such that the clip 63c of the support member 60c is fastened to the end of the lens unit 30, the shape of the clip 63c having the elasticity may be deformed.

Referring to FIGS. 12 through 16C, when the clip 63c of the support member 60c is fastened to the end of the lens unit 30, the clip 63c may be restored to its original shape.

As described above, when the external force in the Z-axis direction is applied, since the clips 63a, 63b, and 63c and/or the clip holders 62a, 62b, and 62c are deformed by elastic deformation, and the end of the lens unit 30 is secured to the substrate, a combination of the clips and the clip holders may be called as a securing portion. In other words, the end of the pad extends in the Z-axis direction (i.e., a direction perpendicular to the substrate) to form the securing portion, and the end of the lens unit 30 is secured to the substrate by this securing portion, and thus, it is possible to prevent a gap from being generated between the lens unit and the substrate due to a partial contact surface of the lens unit being detached from the substrate.

More specifically, a hole is formed in the securing portion, and when the external force in the Z-axis direction is applied, the securing portion is elastically deformed and the end of the lens unit is inserted into this hole and secured to the substrate, through which it is possible to prevent the gap from being generated between the lens unit and the substrate due to the partial contact surface of the lens unit being detached from the substrate.

In addition, a pressing portion extending outwardly (or extending curvedly is formed at an end of the securing portion, and when the external force in the Z-axis direction is applied, the pressing portion is elastically deformed and the end of the lens unit is inserted into a lower side of the pressing portion and secured to the substrate, through which it is possible to prevent the gap from being generated between the lens unit and the substrate due to the partial contact surface of the lens unit being detached from the substrate.

FIG. 17 is a perspective view illustrating a support member according to a fourth exemplary embodiment of the present disclosure.

Referring to FIG. 17, the support member according to the fourth exemplary embodiment of the present disclosure may be implemented as a metal sheet. The support member according to the fourth exemplary embodiment of the present disclosure may include a hump, a clip holder, a clip, and a pad similarly to the support member according to the third exemplary embodiment of the present disclosure.

However, unlike the support member according to the third exemplary embodiment of the present disclosure shown in FIG. 12, the hump in the support member according to the fourth exemplary embodiment of the present disclosure shown in FIG. 17 is implemented not to include a hole. In this case, since the hump does not include the hole, there is an effect that a process of manufacturing the support member may be further simplified.

Since the support member according to the fourth exemplary embodiment of the present disclosure does not have the hole in the hump, there is an effect that the support member may be manufactured more easily. In addition, although the hole is not provided in the hump, when the hump is implemented such that a roughness of a surface in contact with the glue is equal to or greater than a predetermined threshold, there is an effect that a frictional force between the hump and the glue may be increased, and the support member may more firmly support the glue.

In the present disclosure, although the support members according to the first through fourth exemplary embodiments are shown and mainly described, the inventive concepts are not limited thereto, but the support members mounted in the lens module may be implemented in a form other than those of the first through fourth exemplary embodiments so as to prevent the glue or the lens from being detached from the substrate.

For example, the support member may have a more curved hump so as to increase the contact area with the glue. For example, the support member may include a plurality of holes in the hump, and may include at least one hole in the pad.

FIGS. 18A through 18D are diagrams illustrating a process of designing a lens module according to an exemplary embodiment of the present disclosure.

Referring to FIGS. 1 through 18A, a plurality of light emitting devices 20 and a plurality of support members 60 may be mounted on the substrate 10 during an SMT process. Herein, each of the plurality of support members 60 may be any one of the support members according to the first through fourth exemplary embodiments of the present disclosure.

Although FIG. 18A shows an example in which 12 support members 60 are mounted on the substrate, the inventive concepts are not limited thereto, but various numbers of support members 60 may be installed on the substrate 10 during the SMT process.

Referring to FIGS. 1 through 18B, the lens unit 30 may be disposed on the substrate 10 on which the plurality of light emitting devices 20 and the plurality of support members 60 are mounted. In this case, at least one end of the lens unit 30 may be secured by a clip or a clip holder included in each of the plurality of support members 60. That is, the lens unit 30 may be firmly connected to the substrate 10 by the plurality of support members 60 mounted on the substrate 10.

Referring to FIGS. 1 through 18C, the glue 40 may be filled in the lens module in which the substrate 10 and the lens unit 30 are connected using a special mold set in advance. Herein, the glue 40 may comprise sealing glue or plastic.

Referring to FIGS. 1 through 18D, when the glue 40 filled in the lens module is hardened (or solidified), the lens module including the support member according to exemplary embodiments of the present disclosure may be completed.

FIGS. 19A through 19C are cross-sectional views illustrating an exemplary embodiment in which a support member is implemented on the substrate of the present disclosure.

Referring to FIGS. 1 through 19A, a glue 40-1 disposed on the substrate 10 may be implemented as a plastic type. In this case, the substrate 10 and the glue 40-1 may be firmly connected to each other by a frictional force between the substrate 10 and the glue 40-1.

However, in FIG. 19B, when a surface of the substrate 10 is smooth and an adhesion between the substrate 10 and the glue 40-1 is reduced, the glue 40-1 is detached from the substrate 10, and thus, a gap may be generated between a portion of the glue 40-1 and the substrate 10.

To solve a drawback that the plastic-type glue 40-1 is detached from the substrate 10, a method is suggested in the present disclosure that a support member 70 is included in the substrate 10 as shown in FIG. 19C. The support member 70 may be implemented in a form of a countersunk hole, and when the plastic glue 40-1 is filled in the countersink hole, it is possible to prevent the glue 40-1 from being detached from the substrate 10.

A shape of the support member 70 shown in FIG. 19C is only one form for solving a technical problem of the present disclosure, and the inventive concepts are not limited to the shape of the support member 70 shown in FIG. 19C, but the support member 70 may be implemented in various forms.

Although some embodiments have been described above with reference to the preferred embodiment of the present invention, those skilled in the art or those having ordinary skill in the art will understand that various modifications and variations of the present invention can be made without departing from the spirit and scope of the present invention described in the claims to be described later.

Accordingly, the technical scope of the present invention should not be limited to the content described in the detailed description of the specification, but should be defined by the claims.

DESCRIPTION OF REFERENCE NUMERALS

100: lens module, 10: substrate, 20: light emitting device
30: lens unit, 40 and 40-1: glue
50: fastening member, 60, 60a, 60b, 60c, and 70: support member
61a, 61b, and 61c: hump, 62a, 62b, and 62c: clip holder
63a, 63b, and 63c: clip, 64a, 64b, and 64c: pad

The invention claimed is:

1. A lens module, comprising:
a substrate having a plurality of light emitting regions;
a light emitting device provided in each of the plurality of light emitting regions and configured to emit light;
a lens unit provided on the substrate to cover the light emitting device;
a glue portion disposed to contact the substrate and the lens unit and configured to secure the substrate and the lens unit; and
a support member provided in the glue portion, and mounted on the substrate,
wherein the support member includes a hump that increases a contact area between the support member and the glue portion, and a clip connected to the lens unit.

2. The lens module of claim 1,
wherein the support member further comprises a metal sheet, a clip holder for supporting the clip, and a pad mounted on the substrate.

3. The lens module of claim 2, wherein:
the clip holder has elasticity such that a shape thereof is deformed when an external force in a Z-axis direction perpendicular to the substrate is applied, and
the shape of the clip holder is deformed such that the clip and an end of the lens unit are fastened, and thereafter, when the clip and the lens unit are engaged, the deformed shape of the clip holder is restored.

4. The lens module of claim 3, wherein:
The shape of the clip holder is configured to correspond to a shape of the end of the lens unit, or
a length of the clip holder is configured to have a length corresponding to a predetermined third ratio to a thickness of the end of the lens unit.

5. The lens module of claim 2, wherein:
the clip has elasticity such that a shape of the clip is deformed when an external force in a Z-axis direction perpendicular to the substrate is applied, and
the shape of the clip is deformed such that the support member secures the lens unit, and thereafter, when the lens unit is secured, the deformed shape of the clip holder is restored.

6. The lens module of claim 5, wherein:
the shape of the clip is configured to correspond to the shape of an end of the lens unit, or
a distance between the clip and the substrate is configured in a predetermined fourth ratio with respect to a thickness of the end of the lens unit.

7. The lens module of claim 1, wherein a hole is provided in the hump.

8. The lens module of claim 1, wherein:
the hump has a length corresponding to a predetermined first ratio to a length of the support member in contact with the substrate, or
the hump has a length corresponding to a predetermined second ratio to a thickness of the glue portion.

9. The lens module of claim 1, comprising:
a plurality of support members of different types from one another determined in consideration of shapes of the substrate, the lens unit, and the glue portion.

10. The lens module of claim 9, wherein the plurality of support members comprises at least two support members among:
a first support member including a first hump having a first length and including a hole;
a second support member including a second hump having the first length and not including the hole;
a third support member including a third hump having a second length shorter than the first length and including the hole; and
a fourth support member including a fourth hump having the second length and not including the hole.

11. The lens module of claim 1, wherein the substrate includes a terminal for providing power to the light emitting device.

12. The lens module of claim 1, wherein the light emitting device includes a first conductivity type semiconductor layer, a second conductivity type semiconductor layer, and an active layer disposed between the first conductivity type semiconductor layer and the second conductivity type semiconductor layer.

13. The lens module of claim 1, wherein the lens unit includes a lens having a curved surface and a flat portion disposed around the lens.

14. The lens module of claim 1, wherein the lens unit includes a lens including quartz or a polymer organic material.

15. The lens module of claim 1, wherein the glue portion includes at least one of an acrylic glue, a silicone glue, a urethane glue, a polyvinyl butyral glue (PMB), an ethylene-vinyl acetate glue (EVA), polyvinylether, saturated amorphous polyester, or melamine resin.

* * * * *